US011088247B2

(12) United States Patent
Reboh et al.

(10) Patent No.: US 11,088,247 B2
(45) Date of Patent: Aug. 10, 2021

(54) METHOD OF FABRICATION OF A SEMICONDUCTOR DEVICE INCLUDING ONE OR MORE NANOSTRUCTURES

(71) Applicants: Commissariat A L'Energie Atomique et aux Energies Alternatives, Paris (FR); International Business Machines Corporation, Yorktown Heights, NY (US)

(72) Inventors: Shay Reboh, Grenoble (FR); Kangguo Cheng, Schenectady, NY (US); Remi Coquand, Les Marches (FR); Nicolas Loubet, Guilderland, NY (US)

(73) Assignees: Commissariat A L'Energie Atomique et aux Energies Alternatives, Paris (FR); International Business Machines Corporation, Yorktown Heights, NY (US)

(*) Notice: Subject to any disclaimer, the term of this patent is extended or adjusted under 35 U.S.C. 154(b) by 0 days.

(21) Appl. No.: 16/812,530

(22) Filed: Mar. 9, 2020

(65) Prior Publication Data

US 2020/0212179 A1    Jul. 2, 2020

Related U.S. Application Data

(62) Division of application No. 15/852,050, filed on Dec. 22, 2017, now abandoned.

(51) Int. Cl.
*H01L 29/06* (2006.01)
*H01L 29/775* (2006.01)
(Continued)

(52) U.S. Cl.
CPC .......... *H01L 29/0673* (2013.01); *B82Y 10/00* (2013.01); *B82Y 40/00* (2013.01);
(Continued)

(58) Field of Classification Search
CPC ..... H01L 29/0669–068; H01L 29/0665; H01L 2924/13061; H01L 29/7853–2029/7858;
(Continued)

(56) References Cited

U.S. PATENT DOCUMENTS 9,443,931 B2 * 9/2016 Zang ................... H01L 21/3065
9,484,267 B1   11/2016 Cheng et al.
(Continued)

OTHER PUBLICATIONS

S. Barraud et al.: "Vertically Stacked-Nano Wires MOSFETs in a Replacement Metal Gate Process with Inner Spacer and SiGe Source/Drain"—IEDM 2016, 4 pages.
(Continued)

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

A method of fabrication of a semiconductor device including implementation of fabrication of at least one stack made on a substrate, including at least one first portion of a first semiconductor and at least one second portion of a second semiconductor which is different from the first semiconductor, so the thickness of at least the first portion is substantially equal to the thickness of at least one nanostructure, and wherein the first or second semiconductor is capable of being selectively etched relative to the second or first semiconductor, respectively, fabrication, on a part of the stack, of external spacers and at least one dummy gate, etching of the stack such that the remaining parts of the first and second portions are arranged beneath the dummy gate and beneath the external spacers and form a stack of nanowires, after the etching of the stack, thermal treatment of the stack of nanowires.

15 Claims, 11 Drawing Sheets

(51) Int. Cl.
| | |
|---|---|
| H01L 29/10 | (2006.01) |
| B82Y 10/00 | (2011.01) |
| B82Y 40/00 | (2011.01) |
| H01L 29/76 | (2006.01) |
| H01L 21/02 | (2006.01) |
| H01L 21/225 | (2006.01) |
| H01L 21/306 | (2006.01) |
| H01L 21/324 | (2006.01) |
| H01L 29/08 | (2006.01) |
| H01L 29/165 | (2006.01) |
| H01L 29/423 | (2006.01) |
| H01L 29/66 | (2006.01) |

(52) U.S. Cl.
CPC .... *H01L 21/02532* (2013.01); *H01L 21/2251* (2013.01); *H01L 21/30604* (2013.01); *H01L 21/324* (2013.01); *H01L 29/0847* (2013.01); *H01L 29/10* (2013.01); *H01L 29/1033* (2013.01); *H01L 29/165* (2013.01); *H01L 29/42392* (2013.01); *H01L 29/6656* (2013.01); *H01L 29/66439* (2013.01); *H01L 29/66545* (2013.01); *H01L 29/66553* (2013.01); *H01L 29/66636* (2013.01); *H01L 29/7613* (2013.01); *H01L 29/775* (2013.01)

(58) Field of Classification Search
CPC ......... H01L 29/66469; H01L 29/66439; Y10S 977/938
See application file for complete search history.

(56) References Cited

U.S. PATENT DOCUMENTS

| | | |
|---|---|---|
| 2015/0332971 A1 | 11/2015 | Ching et al. |
| 2016/0155800 A1 | 6/2016 | Zang et al. |
| 2017/0221708 A1 | 8/2017 | Bergendahl et al. |
| 2018/0114834 A1 | 4/2018 | Cheng et al. |

OTHER PUBLICATIONS

N. Loubet et al.: "Staked Nanosheet Gate-All-Around Transistor to Enable Sealing Beyond FinFET", 2017 Symposium on VLSI Technology, Digest of Technical Papers—T230-231, 2017 pp. 230-231.

* cited by examiner

US 11,088,247 B2

METHOD OF FABRICATION OF A SEMICONDUCTOR DEVICE INCLUDING ONE OR MORE NANOSTRUCTURES

CROSS REFERENCE TO RELATED APPLICATION

This application is a divisional of U.S. application Ser. No. 15/852,050, filed on Dec. 22, 2017, the entire contents of which is incorporated herein by reference.

TECHNICAL FIELD AND PRIOR ART

The invention relates to the fabrication of semiconductor devices including one or more nanostructures. The invention applies in particular to the fabrication of nanostructures within semiconductor devices such as FET type transistors, advantageously GAA-FET (Gate-all-Around Field Effect Transistor) type, or SET (Single Electron Transistor) type transistors.

Several approaches are known for making nanostructures, in particular so-called organised nanostructures.

First of all methods of the "Top-down" type exist, which propose making nanostructures through the implementation of steps for deposition of one or more materials, of lithography according to the desired design for the nanostructures, then etching to obtain the desired nanostructures within the layers of deposited materials. The dimensions and densities of nanostructures that may be obtained with this approach are nevertheless limited due to the limits to the precision that can be achieved by lithography. Thus lithography is not suitable for making nanostructures whose dimensions are less than about 10 nm. Lithography moreover is also not suitable for making vertically organised structures, that is, along a vertical surface.

"Bottom up" type methods also exist which propose making nanostructures via a controlled individual arrangement of atoms or molecules of materials intended to form nanostructures one above the other. Such methods are nevertheless limited to the individual fabrication of very small nanostructures and are not suitable for industrial fabrication of nanostructures.

DESCRIPTION OF THE INVENTION

One aim of the present invention is to propose a new method of fabricating a semiconductor device comprising at least one or more organised nanostructures which allow vertical and horizontal control of the positioning and of the dimensions of the nanostructure or nanostructures, and which is compatible with the fabrication of a nanostructure or nanostructures of very small dimensions, for example less than about 10 nm.

In order to achieve this, the present invention proposes a method for making a semiconductor device comprising at least the implementation of the following steps:

fabrication of at least one stack comprising at least one first portion of a first semiconductor and at least one second portion of a second semiconductor which is different from the first semiconductor, such that the thickness of at least the first portion is substantially equal to the thickness of at least one nanostructure that it is intended to fabricate, thermal treatment of the stack at a temperature which causes at least one surface migration of atoms of the second semiconductor from the second portion towards at least one part of the first portions which exhibits at least one free surface, and in particular not covered by the second portion, and at and/or within which the nanostructure comprising at least atoms of the second semiconductor is formed.

This method implements a surface migration effect of semiconductor atoms in order to make the nanostructure or nanostructures, where this surface migration of semiconductor atoms is triggered by an addition of sufficient energy for these atoms. The nanostructure is formed in an auto-organised manner due to the fact that the part of the first portion which forms, for example, an edge and/or an extremity of the first portion, comprises a free surface, that is not covered by another element and in particular not covered by the second portion, which forms the surface at which the atoms of the second semiconductor migrate to form the nanostructure. The thickness of the nanostructure is automatically predefined by the chosen thickness of the first portion made. The thickness of the first portion corresponds to the dimension of the first portion which is substantially perpendicular to an interface between the first and second portions.

Moreover, the depth of the nanostructure (dimension substantially perpendicular to the surface of the first portion which is not covered by the second portion and from which the nanostructure is formed) that is made may depend on the operating parameters of the thermal treatment, or annealing, in particular on the temperature and the time over which the thermal treatment is carried out. In certain cases the depth of the nanostructure may be equal to the thickness of the nanostructure. The characteristics of the nanostructure that is made depend on the addition of energy received. It is thus possible to choose these parameters such that the depth of the nanostructure made is small, for example between about 1 nm and 10 nm. Finally, the other dimensions of the nanostructure may be defined by the dimensions of the part of the first portion at and/or within which the nanostructure is made.

All the dimensions as well as the positioning of the nanostructure are therefore well controlled indirectly via the dimensions and the positioning of the first portion as well as via the parameters for implementing the thermal treatment which cause the surface migration of atoms of the second semiconductor of the second portion.

The method may be such that:

the first semiconductor comprises Si, and/or, the second semiconductor comprises Ge, and/or, the thermal treatment temperature is between about 750° C. and 850° C., and/or the thermal treatment is implemented in an atmosphere containing hydrogen, for example an atmosphere of pure dihydrogen, or of a mixture of dihydrogen and one or more other gases ($N_2$, He, etc.).

The presence of hydrogen in the atmosphere during the surface migration of the atoms of the second semiconductor towards the first semiconductor improves the mobility of the atoms of the second semiconductor towards the part of the first portion where the nanostructure is formed.

When the first semiconductor corresponds to silicon and the second semiconductor corresponds to germanium or SiGe, thermal treatment implemented at a temperature of between about 750° C. and 850° C. causes at least one surface migration of germanium atoms from the second portion into the silicon of the first portion, which then forms the nanostructure which comprises SiGe.

The second semiconductor may comprise SiGe which has, for example, a germanium concentration between about 20% and 80%.

The thickness of the first portion may be, for example, between about 4 nm and 20 nm.

According to one advantageous configuration, the stack may comprise several alternating first and second portions, where the implementation of the thermal treatment may in this case cause at least one surface migration of atoms of the second semiconductor from the second portions towards parts of the first portions which each exhibit at least one free surface, in particular not covered by the second portions and at each of which, or in each of which, at least one nanostructure is formed which comprises at least atoms of the second semiconductor. This advantageous configuration in particular allows organised nanostructures to be made along a vertical surface and which are stacked one above the other.

In this case several second portions may comprise second semiconductors with atomic compositions and/or concentrations which differ from one to another, forming nanostructures which comprise different semiconductors. Two semiconductors with different compositions correspond to two semiconductors which do not have the same type of atoms, that is, which correspond to two semiconductors of different natures. Two semiconductors with different atomic concentrations correspond to two semiconductors which have the same types of atoms but in different proportions from one to the other.

Advantageously, each second portion may comprise SiGe which has a concentration of germanium which is different from that of the SiGe of other second portions.

Several of the first portions may comprise different thicknesses from one to another, and/or several of the second portions may comprise different thicknesses from one to another. In this case the nanostructures obtained comprise different thicknesses.

According to one specific embodiment, the method may be such that:
 the stack is made on a substrate and
 the second semiconductor is capable of being selectively etched relative to the first semiconductor,
 the method may moreover comprise, between the fabrication of the stack and the thermal treatment of the stack, at least the implementation of the following steps:
  fabrication on a part of the stack of external spacers and at least one dummy gate (or temporary gate) arranged between the external spacers,
  etching of the stack such that the remaining parts of the first and second portions are arranged beneath the dummy gate and beneath the external spacers and form a stack of nanowires,
 wherein said at least one part of the first portion corresponds to extremities of the remaining part of the first portion,
 the method may moreover comprise, after the implementation of the thermal treatment forming the nanostructures at the extremities of the remaining part of the first portion, the implementation of the following steps:
  fabrication of source and drain regions by epitaxy of semiconductor from at least the nanostructures, and such that the second semiconductor is capable of being selectively etched relative to the semiconductor of the source and drain regions,
  removal of the dummy gate and of the remaining part of the second portion,
  fabrication of a gate between the external spacers and surrounding a channel for the semiconductor device formed by the remaining part of the first portion.

The invention also relates to a method for making a semiconductor device, comprising at least the implementation of the following steps:
 a) fabrication, on a substrate, of a stack of at least one first portion of a first semiconductor arranged on at least one second portion of at least one second semiconductor capable of being selectively etched relative to the first semiconductor,
 b) fabrication on a part of the stack of external spacers and at least one dummy gate arranged between the external spacers,
 c) etching of the stack such that the remaining parts of the first and second portions are arranged beneath the dummy gate and beneath the external spacers and form a stack of nanowires,
 d) thermal treatment implemented at a temperature which causes at least one surface migration of atoms of the second semiconductor of the remaining part of the second portion towards the extremities of the remaining part of the first portion and which form, at the extremities of the remaining part of the first portion, nanostructures which comprise at least atoms of the second semiconductor,
 e) fabrication of source and drain regions by epitaxy of semiconductor from at least the nanostructures, and such that the second semiconductor is capable of being selectively etched relative to the semiconductor of the source and drain regions,
 f) removal of the dummy gate and of the remaining part of the second portion,
 g) fabrication of a gate between the external spacers and surrounding a channel of the semiconductor device formed by the remaining part of the first portion.

In such a method the nanostructures may therefore be formed at the extremities of the remaining part or parts of the first portion or portions forming in particular the channel of the semiconductor device.

The semiconductor of the source and drain regions may be doped silicon.

The method may moreover comprise, between the stack etching step and the source and drain regions fabrication step, the implementation of the following steps:
 partial etching of the remaining part of the second portion from the extremities of the remaining part of the second portion revealed by the etching of the stack, forming cavities arranged at least beneath the external spacers,
 fabrication of internal spacers within the cavities.

These steps may be implemented before or after the thermal treatment step forming the nanostructures. In other words, the internal spacers may be made before or after the nanostructures.

According to one particular embodiment, the method may moreover comprise, between the thermal treatment step and the source and drain region fabrication step, the implementation of a step for removing the nanostructures, where the source and drain regions are made by epitaxy of semiconductor from at least the remaining portion of the first portion. Due to the fact that the dimensions and the positioning of the nanostructures are well controlled, the position of the junctions between the remaining part or parts of the first portion or portions forming the channel and the source and drain regions is also well-controlled, in particular in relation to the dummy gate, which avoids positioning of the source and drain regions in locations exposed during the etching of the dummy gate. This is particularly advantageous when the source and drain regions comprise a material which may be etched by the etching agent used during the removal of the dummy gate, such as for example SiGe.

According to another specific embodiment, the method may be such that:

the method moreover comprises, between the source and drain region fabrication step and the step for removal of the dummy gate and of the remaining part of the second portion, the implementation of doping of the semiconductor of the source and drain regions, then annealing which diffuses dopants into the semiconductor of the source and drain regions, or the source and drain region fabrication step is implemented such that the semiconductor of the source and drain regions is doped.

In this case the presence of nanostructures between the source and drain regions and the remaining part of the first portion or portions forming the semiconductor device channel may ensure dopants do not diffuse into the channel.

According to another specific embodiment, the method may be such that:

the stack is made on a substrate and
the first semiconductor is capable of being selectively etched relative to the second semiconductor, where the method may moreover comprise, between the fabrication of the stack and the thermal treatment of the stack, at least the implementation of the following steps:

fabrication, on a part of the stack, of external spacers and of at least one dummy gate arranged between the external spacers, etching of the stack such that the remaining parts of the first and second portions are arranged beneath the dummy gate and beneath the external spacers and form a stack of nanowires, wherein said at least one part of the first portion may correspond to the extremities of the remaining part of the first portion and the nanostructures may form etch stop elements intended to protect the semiconductor of the source and drain regions, where the method may moreover comprise, after the implementation of the thermal treatment forming the nanostructures at the extremities of the remaining part of the first portion, the implementation of the following steps:

fabrication of source and drain regions by epitaxy of semiconductor from at least the nanostructures and the remaining part of the second portion, removal of the dummy gate and of the remaining part of the first portion, fabrication of a gate between the external spacers and surrounding a channel of the semiconductor device formed by the remaining part of the second portion.

The invention also relates to a method for making a semiconductor device, comprising at least the implementation of the following steps:

a) fabrication, on a substrate, of a stack of at least one first portion of a first semiconductor whereupon is arranged at least one second portion of at least one second semiconductor, where the first semiconductor is capable of being selectively etched relative to the second semiconductor, b) fabrication, on a part of the stack, of external spacers and at least one dummy gate arranged between the external spacers, c) etching of the stack such that the remaining parts of the first and second portions are arranged beneath the dummy gate and beneath the external spacers and form a stack of nanowires, d) thermal treatment implemented at a temperature which causes at least one surface migration of atoms of the second semiconductor of the remaining part of the second portion towards the extremities of the remaining part of the first portion and which form, at the extremities of the remaining part of the first portion, nanostructures which comprise at least atoms of the second semiconductor, and which form etch stop elements intended to protect the semiconductor of the source and drain regions, e) fabrication of source and drain regions by epitaxy of semiconductor from at least the nanostructures and the remaining part of the second portion, f) removal of the dummy gate and of the remaining part of the first portion, g) fabrication of a gate between the external spacers and surrounding a channel of the semiconductor device formed by the remaining part of the second portion.

In this case the nanostructures act as stop portions during the removal of the dummy gate and protect the source and drain regions during this removal of the dummy gate.

According to another specific embodiment, the method may be such that:

the stack is made on a substrate and
the second semiconductor is capable of being selectively etched relative to the first semiconductor, where the method may moreover comprise, between the fabrication of the stack and the thermal treatment of the stack, at least the implementation of the following steps:

fabrication, on a part of the stack, of external spacers and at least one dummy gate arranged between the external spacers, etching of the stack such that the remaining parts of the first and second portions are arranged beneath the dummy gate and beneath the external spacers and form a stack of nanowires, removal of the dummy gate, etching of at least one region of the remaining part of the second portion not covered by the external spacers, that is the region previously covered by the dummy gate and which is located between the regions of the remaining part of the second portion which are covered by the external spacers, wherein said at least one part of the first portion corresponds to a region of the remaining part of the first portion not covered by the external spacers, that is, the region previously covered by the dummy gate and which is located between the regions of the remaining part of the first portion which are covered by the external spacers, where the method may moreover comprise, after the thermal treatment has been implemented, the implementation of the following steps:

fabrication of a gate between the external spacers, covering the nanostructure, etching of the remaining part of the second portion, fabrication of internal spacers beneath the external spacers and in the locations formed by etching of the remaining part of the second portion, fabrication of source and drain regions by epitaxy of semiconductor from at least the remaining part of the first portion, The above method is well suited to the fabrication of a semiconductor device which corresponds to a SET transistor. Indeed, with this method the part of the first portion towards which the atoms of the second semiconductor migrate, and which is intended to form a quantum island of the SET transistor, advantageously has dimensions (for example dimensions of sides in a portion which is substantially parallelepiped in shape) of less than about 10 nm. This method also has the advantage of forming the quantum island in an auto-aligned manner relative to other elements of the transistor (in particular the Coulomb blockade barriers formed by the remaining parts of the first portion which are adjacent to the nanostructure and the spacers).

The above methods advantageously apply to the fabrication of semiconductor devices which correspond to transistors, for example of the GAA-FET or SET type, or more generally to transistors which comprise one or more nanowires, or to all semiconductor devices wherein quantum confinement can be performed.

BRIEF DESCRIPTION OF THE DRAWINGS

The present invention will be better understood on reading the description of example embodiments given purely as an indication and in no sense restrictively, making reference to the appended illustrations in which.

Identical, similar or equivalent parts of the various figures described hereafter bear the same numeric references so as to facilitate passing from one figure to another.

In order to make the figures more readable, the various parts shown in the figures are not necessarily shown at a uniform scale.

The various possibilities (alternatives and embodiments) must be understood as not being mutually exclusive, and as being capable of being combined with one another.

DETAILED DESCRIPTION OF SPECIFIC EMBODIMENTS

Reference is first of all made to FIGS. 1 to 4, which show steps of a method for making a semiconductor device 200 according to a first embodiment.

Figure 1:
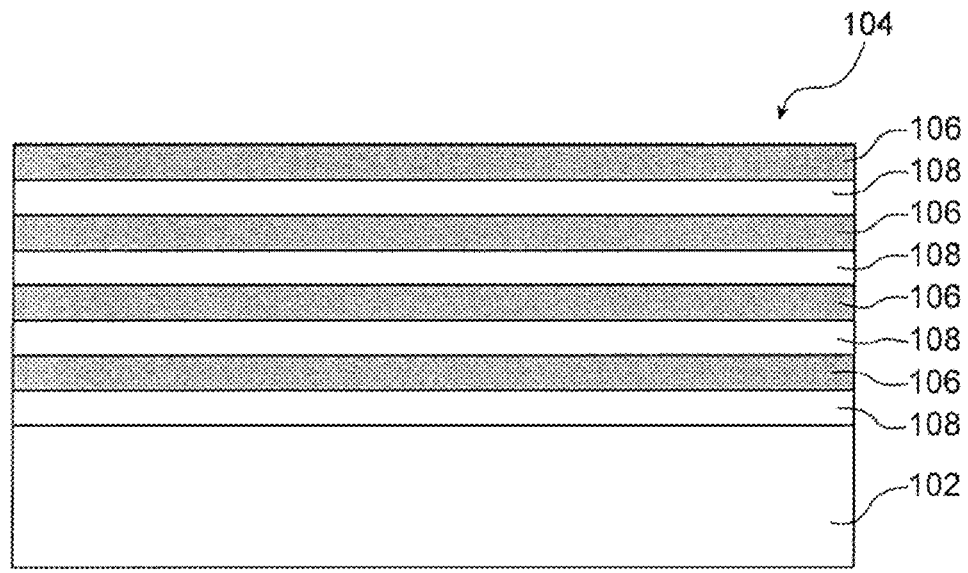
FIGS. 1, 2, 3 and 4 show the steps in a method for making a semiconductor device which is the subject of the present invention, according to a first specific embodiment.

A stack 104 of first layers 106 comprising a first semiconductor and of second layers 108 comprising a second semiconductor which is different from the first semiconductor, arranged in an alternating manner one above the other, is made on a substrate 102 (FIG. 1). The substrate 102 corresponds, for example, to a semiconductor substrate such as a silicon substrate. The substrate 102 is here a "bulk" type substrate but it may correspond to another type of substrate, for example a SOI (Silicon On Insulator) or SiGeOI (SiGe On Insulator) substrate.

The number of first layers 106 and of second layers 108 is chosen in particular depending on the structure of the semiconductor device 200 to be made. For example, when the device 200 corresponds to a transistor which comprises one or more nanowires, for example of the GAA-FET type, the number of layers 106, 108 is chosen depending on the number of nanowires to be made in order to form the channel of the transistor.

The first layers 106 are intended to form first portions of the first semiconductor on and/or in which nanostructures 100 are made, and the second layers 108 are intended to form second portions of the second semiconductor used to supply atoms of the second semiconductor in order to form, by surface migration against and/or into parts of the first portions, the nanostructures 100.

According to one advantageous embodiment, the first layers 106 comprise silicon and the second layers 108 comprise SiGe. The SiGe of the second layers 108 may have a germanium concentration between about 10% and 80% and for example of between about 25% and 50%.

More generally, the first and second semiconductors of the layers 106, 108, and therefore also the semiconductor of the nanostructures 100, correspond to semiconductors of type III-V, that is, which comprise one or more elements from columns III and V of Mendeleev's Periodic Table.

The first layers 106 are made with a thickness which corresponds to that desired for the first portions and for the nanostructures 100. According to one advantageous embodiment, the thicknesses of the first and second layers 106, 108 are, for example, between about 4 nm and 50 nm and are for example equal to 8 nm.

Figure 2:
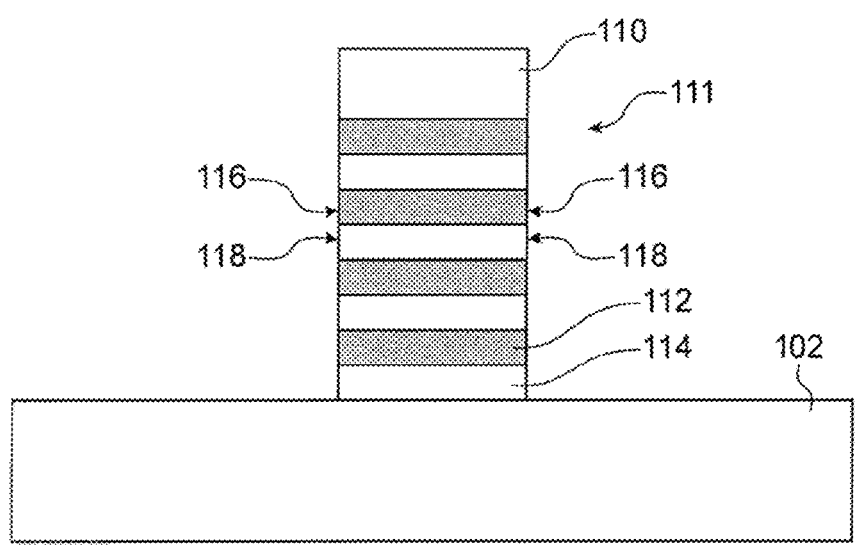
Figure 3:
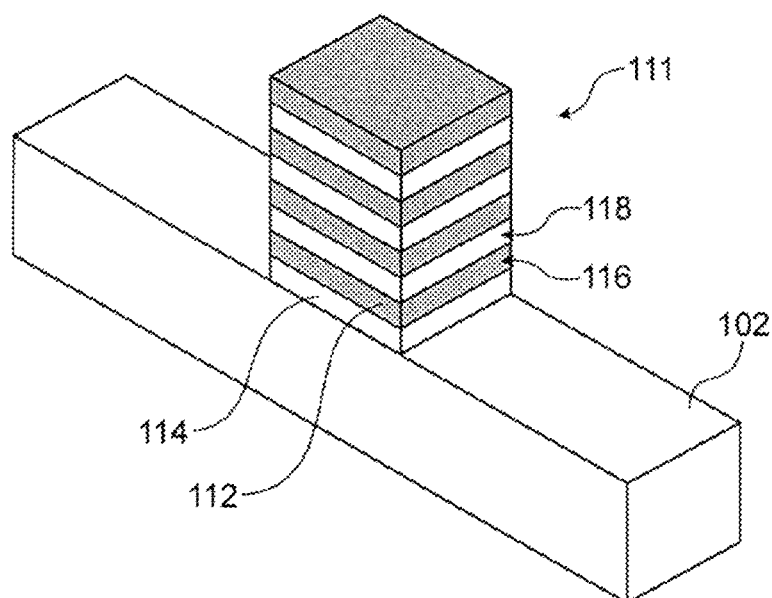

The stack 104 is etched according to the desired dimensions for the first and second portions, via the deposition of an etching mask 110 which is compliant with these dimensions, lithography of the stack 104 thus masked and etching of the stack 104 in order to form a stack 111 which comprises remaining portions of the first and of the second layers 106, 108. The remaining portions of the first layers 106 form first portions 112 which comprise the first semiconductor and the remaining portions of the second layers 108 form second portions 114 which comprise the second semiconductor (FIG. 2). This etching in particular forms lateral faces 116 of the first portions 112 and lateral faces 118 of the second portions 114 which correspond to the edges of the portions 112, 114. FIG. 3 corresponds to a perspective view of the stack 111 of first and second portions 112, 114 obtained, in the absence of the mask 110.

Depending on the dimensions of the first and second portions 112, 114, the stack 111 may form a nanodot type structure or a nanowire type structure which has a longilineal form in a plane parallel to the interface between the stack 111 and the substrate 102.

Figure 4:
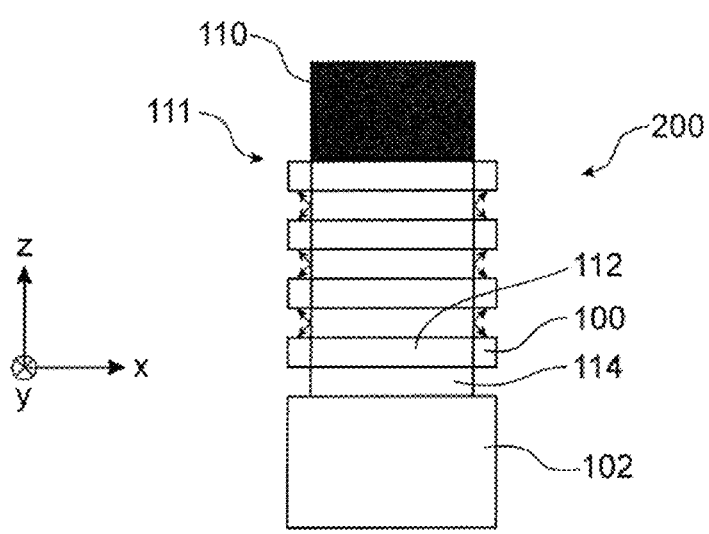

A thermal treatment of the stack 111 is then carried out. The thermal energy provided results in a surface migration of atoms of the second semiconductor from the second portions 114 to the edges of the first portions 112, which here correspond to the lateral faces 116 and forming nanostructures 100 at the lateral faces 116 of the first portions 112 (FIG. 4). In FIG. 4 the arrows symbolically represent the surface migration of atoms of the second semiconductor, resulting from the thermal treatment. In the specific embodiment described here, surface migration of the germanium present in the SiGe of the second portions 114 occurs towards the lateral faces 116 in order to form nanostructures 100 made up of SiGe which is rich in germanium in comparison with the semiconductor in the first portions 112.

The surface migration occurs over a very small depth of material (dimension along the X axis shown in FIG. 4) of the edges of the first portions 112. Thus the depth of the nanostructures 100 made is, for example, between about 1 nm and 10 nm, or even between 1 nm and 5 nm.

In the specific embodiment described here, this thermal treatment is implemented at a temperature between about 750° C. and 1000° C., for a time, for example, of between about 1 minute and 5 minutes. The temperature at which the thermal treatment is implemented is chosen in particular as a function of the nature of the atom or atoms of semiconductor intended for migration, where the thermal energy supplied by this thermal treatment must be sufficient to cause this surface migration. Moreover, in this first embodiment the thermal treatment is implemented under a hydrogen atmosphere. This hydrogen atmosphere facilitates the mobility of the germanium atoms at the lateral faces 116 of the first portions 112.

In general, and depending on the nature of the semiconductors chosen, it is possible for the surface migration to occur from the first portions 112 and/or from the second portions 114 towards parts of the first portions 112 and/or towards parts of the second portions 114. Thus the nanostructures 100 may be formed from the second and/or from the first semiconductors and be arranged at the parts of the first portions 112 and/or of the second portions 114.

In this method the nanostructures 100 are made in an auto-organised manner since the shapes, locations and dimensions of these nanostructures 100 are predefined before the implementation of the thermal treatment forming the nanostructures 100. Thus the thickness (dimension along the Z axis shown in FIG. 4 and perpendicular to the interfaces between the first portions 112 and the second portions 114) of the nanostructures 100 is defined and corresponds to the thickness of the first portions 112, and therefore to the thickness of the first layers 106. The width or the length of the nanostructures 100 (dimension along the Y axis shown by the FIG. 4) is defined by the initial dimensions of the first portions 112 obtained as a result of etching of the stack 104 of layers 106, 108. Finally the depth (dimension along the X axis shown in FIG. 4) of the nanostructures 100 is defined by the conditions (annealing temperature, annealing time, atmosphere wherein annealing is implemented) under which the annealing causing surface migration of chemical species is implemented.

In the first embodiment described above, all the first portions 112 comprise the same first semiconductor and all the second portions 114 comprise the same second semiconductor. Thus all the nanostructures 100 comprise the same semiconductor which is formed of atoms of the first and second semiconductors.

As an alternative to this first embodiment and other embodiments described below, it is possible for the relative compositions and/or concentrations within the first and second semiconductors to be different from one first portion 112 to another and/or from one second portion 114 to another. In this case the atomic compositions and/or concentrations of the semiconductors of the nanostructures 100 that are fabricated are different, depending on their arrangement within the stack, due to the fact that these atomic compositions and/or concentrations of the semiconductors of the nanostructures depend on the atomic composition and/or concentration of the semiconductors adjacent to the portion on and/or in which the nanostructures 100 are made. These composition and/or concentration differences in the semiconductors within the stack 111 may be created by implementing appropriate deposition techniques such as PVD (physical vapour phase deposition), CVD (chemical vapour phase deposition), MBE (molecular beam epitaxy) etc.

Figure 5:
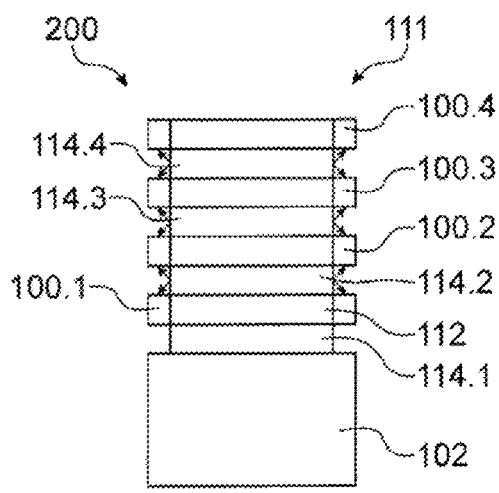
FIG. 5 shows the nanostructures obtained during the implementation of a method for making a semiconductor device which is the subject of the present invention, according to one alternative of the first embodiment.

For example, the composition of the materials deposited to form the stack 111 (coming from stack 104) can be gradually modified from the lower portions (those next to the substrate 102) moving towards the upper portions. One such embodiment example is shown in FIG. 5 in which the semiconductors (SiGe) of the four second portions 114, referred to as 114.1-114.4, have different compositions, and more particularly germanium concentrations which differ from one portion to another. These different compositions are found in the second layers 108 which were used to make the second portions 114. In the example in FIG. 5, the second portion 114.1 which is arranged against the substrate 102, comprises SiGe with a germanium concentration which is equal to about 40%, the following second portion 114.2 comprises SiGe with a germanium concentration equal to about 30%, the following second portion 114.3 comprises SiGe with a germanium concentration equal to about 20% and the last second portion 114.4 comprises SiGe with a germanium concentration equal to about 10%.

These different compositions and/or concentrations from one semiconductor portion to another may also apply to the semiconductors of the first portions 112 (whether the compositions and/or concentrations of the semiconductors of the second portions 114 are different or not from one second portion 114 to another). In all cases, these different compositions and/or concentrations within the semiconductors of the first portions 112 and/or second portions 114 have an impact on the compositions and/or concentrations in the semiconductors of the nanostructures 100. Thus in the example described in association with FIG. 5, the semiconductor of the nanostructures 100.1 comprises a germanium concentration which is greater than that of the semiconductor of the nanostructures 100.2. Similarly, the semiconductor of nanostructures 100.2 comprises a germanium concentration which is greater than that of the semiconductor of nanostructures 100.3. Finally, the semiconductor of nanostructures 100.3 comprises a germanium concentration which is greater than that of the semiconductor of nanostructures 100A. This is due to the fact that the atoms of the semiconductor of the nanostructures 100 mostly come from the second portions 114 of semiconductor directly adjacent to the first portions 112 upon which the nanostructures 100 are made.

It is also possible for the nature of the semiconductors for the different portions 112, 114 to differ from one another. For example, it is possible that portion 114.1 comprises a semiconductor A, that portion 112.1 comprises a semiconductor B which is different to that of A, that portion 114.2 comprises a semiconductor C which is different from A and B etc. It is also possible to have a stack of type: portion 112.1 comprising a semiconductor A, portion 114.1 comprising a semiconductor B, portion 112.2 comprising semiconductor A, portion 114.2 comprising semiconductor C, portion 112.3 comprising semiconductor A etc. The stack 111 may comprise other combinations of different semiconductors stacked one above the other.

In general the composition of the semiconductor of the nanostructures 100 is defined by the composition of the semiconductors of the portions or layers immediately adjacent to the portion or layer against which the nanostructures are formed.

Alternatively, it is possible that the first portions 112 do not have similar thicknesses to each other and/or that the second portions 114 do not have similar thicknesses to each other. For example, by using second portions 114 of different thicknesses, during the thermal treatment these portions 114 provide different quantities of germanium atoms, which leads to nanostructures 100 being obtained which have germanium concentrations which differ from each other due to the fact that the germanium atoms migrate at the surface towards the first adjacent portions 112. A variation in the concentration of atoms which have migrated to form the nanostructures 100 can also be achieved by using first portions 112 which have thicknesses which differ from one to another. Thus by considering two portions 112 where one is thicker than the other, which receive the same quantity of germanium atoms, the concentration of germanium atoms will be less in the first portion 112 which is the thickest.

The method for making nanostructures 100 may be implemented from a stack 111 of portions 112, 114 which form one or more nanodots, or nanopoints, when it is intended to implement a quantum confinement function within this stack 111, or again from a stack 111 of portions 112, 114 forming one or more nanowires, for example when this stack 111 is intended to be used for making a transistor.

The method described above used to make nanostructures 100 is advantageously implemented during methods for making semiconductor devices 200 which advantageously correspond to GAA-FET type transistors or SET transistors. Nevertheless, other types of devices such as, for example, light-emitting devices based on III-V semiconductors, may be made using the fabrication method described above.

A second embodiment of the method for making a semiconductor device 200, which here corresponds to a GAA-FET transistor, is described below in association with FIGS. 6 to 11.

The transistor 200 is made from a stack 104 of layers 106, 108 which comprises two different crystalline semiconductors arranged on the substrate 102. In the second embodiment described here the substrate 102 corresponds to a bulk substrate of semiconductor, for example silicon, upon which is arranged the stack comprising the first and second layers 106, 108 of different semiconductors arranged in an alternating manner one above the other. Each of the first layers 106 is intended to be used in making a semiconductor nanowire of the channel of the transistor 200, and is arranged between two second layers 108 comprising a semiconductor which is both capable of being etched selectively relative to that of the first layers 106 as well as relative to the materials intended to be used subsequently for forming the dummy gate and external spacers, and which is also capable of forming nanostructures 100 by surface migration as previously described. In the second embodiment described here, this stack comprises three first layers 106 and four second layers 108 arranged in an alternating manner such that each of the first layers 106 is arranged between two second layers 108.

The materials of the first and second layers 106, 108 correspond to first and second crystalline semiconductors that may be formed by epitaxy on the substrate 102. In the example described here the substrate 102 and the first layers 106 comprise silicon and the second layers 108 comprise SiGe with a proportion of germanium of between for example about 35% ($Si_{0.65}Ge_{0.35}$) and 50% ($Si_{0.5}Ge_{0.5}$).

Alternatively, the substrate used to form the stack 104 may correspond to a SOI (Silicon On Insulator) substrate with in this case the surface layer, or thin layer, of the SOI substrate which can form one of the second layers 108 of the stack. When the second layers 108 comprise SiGe, enrichment with Ge may be performed in the silicon of the surface layer in order to transform this silicon into SiGe, thus forming a SiGeOI substrate.

Advantageously the substrate 104 and the first and second layers 106, 108 of the stack are suitable for making P type transistors. N type transistors may nevertheless be made by implementing this method.

Figure 6:
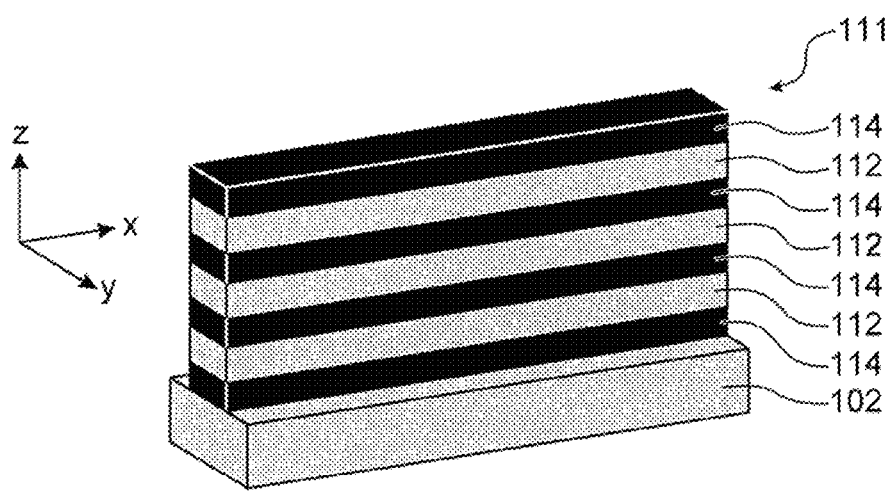
FIGS. 6, 7, 8, 9, 10 and 11 show the steps in a method for making a semiconductor device which is the subject of the present invention, according to a second embodiment.

The stack 104 comprising the first and second layers 106, 108 is etched into the form of an elongated portion as shown in FIG. 6, forming the stack 111 of the first and second portions 112, 114 arranged on the substrate 102. The portions 112, 114 here correspond to nanowires. When several transistors 200 are made collectively from the same stack 104, several stacks 111 are made on the substrate 102.

The first portions 112 from the first layers 106 form first nanowires of the first semiconductor and the second portions 114 from the second layers 108 form second nanowires of the second semiconductor. In the example in FIG. 6, the stack 111 comprises three first nanowires, or three first portions, 112, each arranged between two second nanowires, or two second portions 114.

The width of the stack 111, which corresponds to its dimension along the Y axis shown in FIG. 6 is equal to the desired width of the first portions 112 intended for making the channel of the transistor 200.

Figure 7:
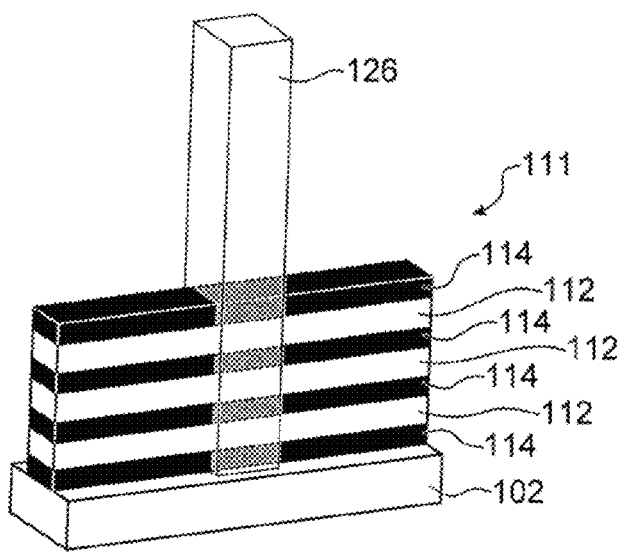

A dummy gate 126, or temporary gate, is then made, for example by lithography and etching, on the stack 111, at the location intended for the future final gate of the transistor 200 (FIG. 7). The dummy gate 126 is formed on the parts of the first portions 112 intended to form the channel of the device 100, as well as on the parts of the second portions 114 between which these parts of the first portions 112 are found, and also cover lateral flanks of the first and second portions 112, 114 of the stack 111.

Figure 8:
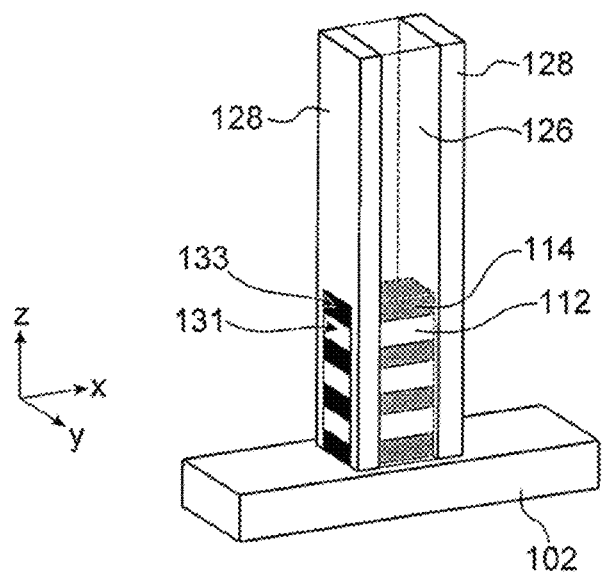

External spacers 128 are then made, for example, by deposition and etching, on the stack 111, and against the lateral flanks of the dummy gate 126 (FIG. 8). The length, or depth, of these external spacers 128 (dimension parallel to the X axis shown in FIG. 8) is, for example, between about 3 and 12 nm. The external spacers 128 are intended to isolate the future gate of the transistor 200 from the source and drain regions that are to be made.

The dummy gate 126 comprises, for example, amorphous or polycrystalline silicon and the external spacers 128 comprise, for example, SiN and/or $Si_3N_4$ and/or SiBCN.

The parts of the stack 111 not covered by the dummy gate 126 and by the external spacers 128 are then etched (FIG. 8), for example during the etching of the external spacers 128. Remaining parts of the first portions 112 are intended to form the channel of the device 100. Each of the remaining parts of the first portions 112 is interposed between two remaining parts of the second portions 114. The extremities of these remaining parts, with references 131 for the remaining parts of the first portions 112 and references 133 for the remaining parts of the second portions 114, are accessible from each side of the external spacers 128.

Figure 9:
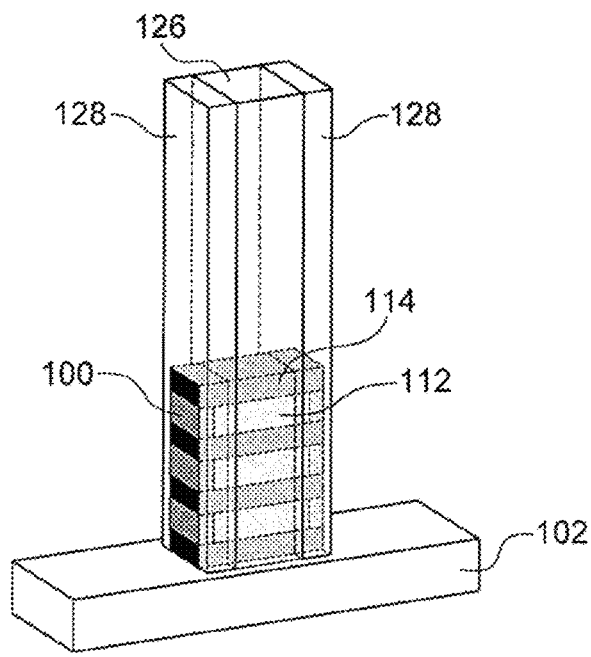

Starting with the stack 111, thermal treatment is carried out in order to form the nanostructures 100 at the extremities 131 of the remaining parts of the first portions 112. Germanium atoms from the SiGe of the remaining parts of the second portions 114 migrate towards the surface of the extremities 131, forming nanostructures 100 at these extremities 131 (FIG. 9).

Figure 10:
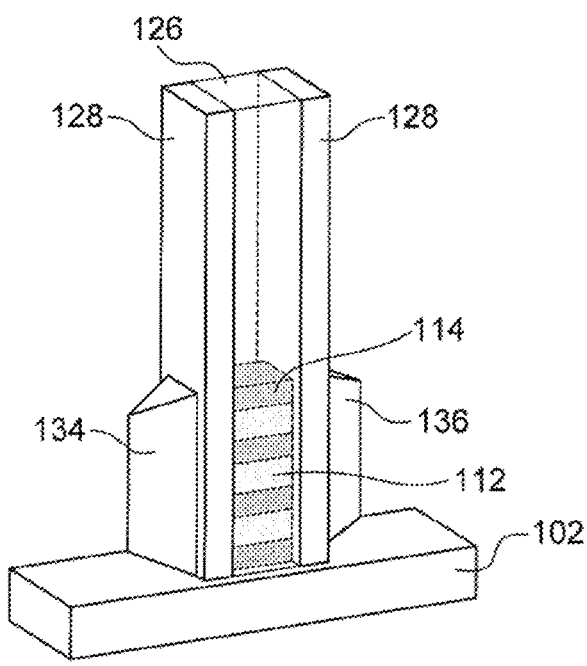

As shown in FIG. 10, source and grain regions 134, 136 are then made by epitaxy on the substrate 102, from the nanostructures 100 and the extremities 133 of the remaining parts of the second portions 114 (and the substrate 102 when it comprises a crystalline semiconductor from which epitaxy may be performed). These source and drain regions 134, 136 are in direct contact with the nanostructures 100. In order that the source and drain region 134, 136 may resist the etching that is then implemented to remove the remaining parts 132 which here comprise SiGe, these source and drain regions 134, 136 comprise, for example, silicon doped with atoms of boron (in the case of a P type transistor) or with atoms of phosphorous (in the case of an N type transistor).

Figure 11:
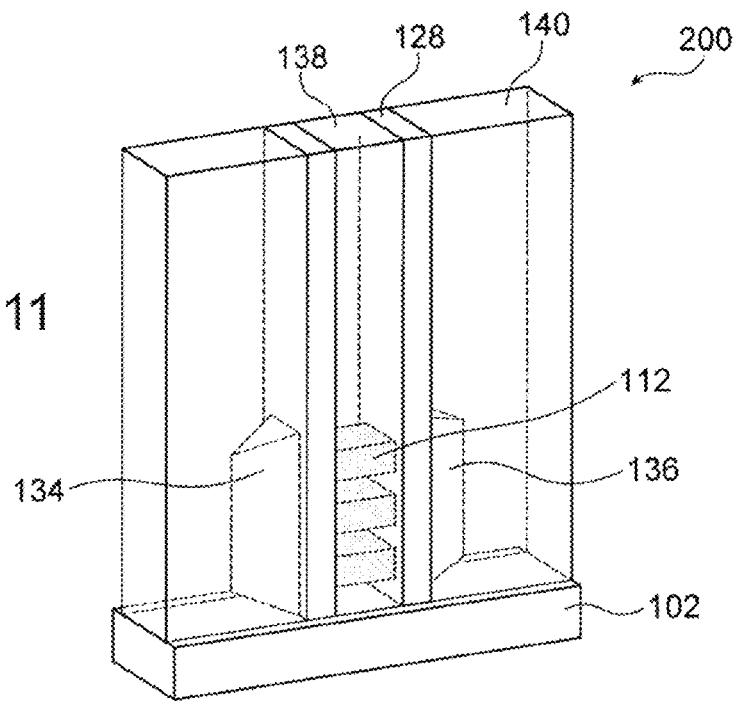

The transistor 200 is completed by removing the dummy gate 126, by removing the remaining parts of the second portions 114 via selective etching relative to the other semiconductors present, and by forming the final gate 138 by deposition of a dielectric gate 138 (for example of "high-k" type or high dielectric permittivity, that is of greater than about 3.9) and of a gate conductor material in the location freed by the etching of the dummy gate 126, in particular around the remaining parts of the first portions 112 forming the channel of the transistor 200 (FIG. 11). The nanostructures 100 are located arranged between the remaining parts of the first portions 112 forming the channel of the transistor 200 and the source and drain regions 134, 136. An encapsulation material 140 is furthermore deposited, covering in particular the source and drain regions 134, 136. According to one particular embodiment, the dimensions of the nanostructures 100 may be such that they are partly recovered by the gate 138.

In this method for fabricating the transistor 200 described above, no internal spacer is made between the gate 138 and the source and drain regions 134, 136.

According to a third embodiment of the method for fabricating the transistor 200, such internal spacers may be made as is described below.

In this third embodiment, the steps described above in association with FIGS. 6 to 9 are implemented. The extremities 133 of the remaining parts of the second portions 114 of SiGe are then selectively etched, in particular relative to the nanostructures 100 which may for example comprise a germanium concentration which is lower than that of the semiconductor of the second portions 114. This etching forms cavities of depth, for example, of between 2 nm and 10 nm.

Figure 12:
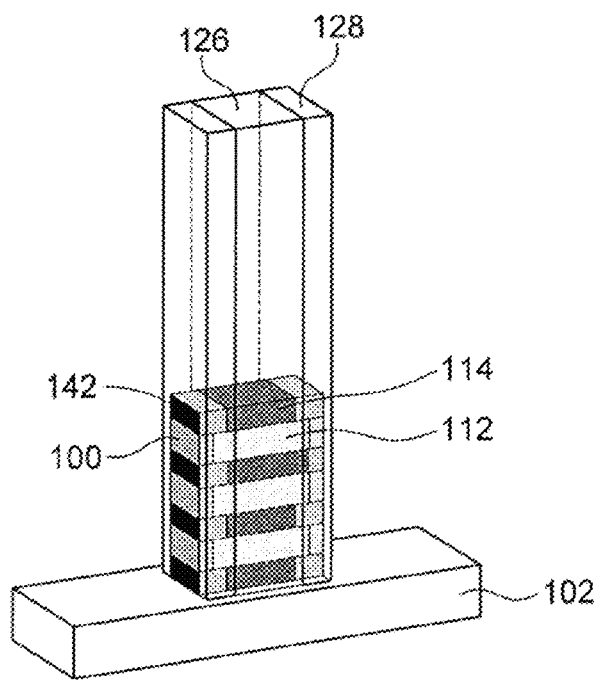
FIG. 12 shows an intermediate structure obtained during the implementation of a method for making a semiconductor device which is the subject of the present invention, according to a third embodiment.

These cavities are then filled with dielectric material forming internal spacers 142 (FIG. 12). This dielectric material, for example SiN, is deposited in the cavities and the surplus dielectric material found outside the cavities is removed, for example by implementing selective cleaning with $H_3PO_4$ when the dielectric material comprises a nitride. The method is then completed as described above for the first method, that is, by making source and drain regions 134, 136, by removing the dummy gate 126 as well as the remaining parts 132, by making the final gate 138 and by depositing the encapsulation material 140.

According to one alternative for this method, the extremities 133 of the second portions 114 of SiGe can be etched before forming nanostructures 100. The nanostructures 100 are then made, then the internal spacers 142 are made (or conversely). The method is then completed as described above.

The fabrication of nanostructures 100 within the transistor 200 can also serve to improve the junctions between the channel and the source and drain regions. Indeed, in a GAA-FET transistor such as obtained by implementing the second method described above, it possesses internal spacers but does not comprise the nanostructures 100, since the semiconductor portions located between the channel and the source and drain region, beneath the external spacers, are not doped. Annealing is generally performed which allows dopants to migrate from the source and drain regions towards these semiconductor portions intended to form extension regions with low electrical resistance. Such annealing does not however result in a geometrically well-defined junction.

A fourth embodiment of the method for making the transistor 200 is described below, in response in particular to the problem presented above.

The intermediate structure shown in FIG. 12 is first of all made as described above, that is comprising the stack of remaining portions of the first and second portions 112, 114 arranged on the substrate 102, the internal spacers 142, the nanostructures 100, the external spacers 128 and the dummy gate 126.

Figure 13:
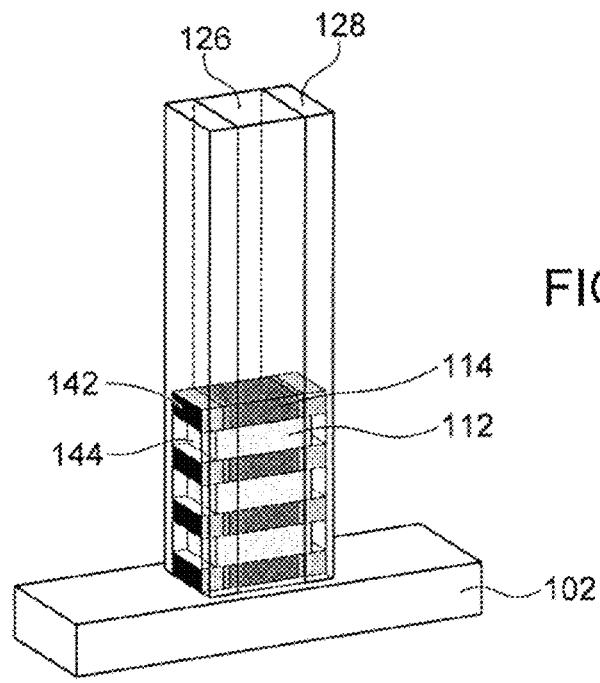
FIGS. 13 and 14 show the intermediate structures obtained during the implementation of a method for making a semiconductor device which is the subject of the present invention, according to a fourth embodiment.
Figure 14:
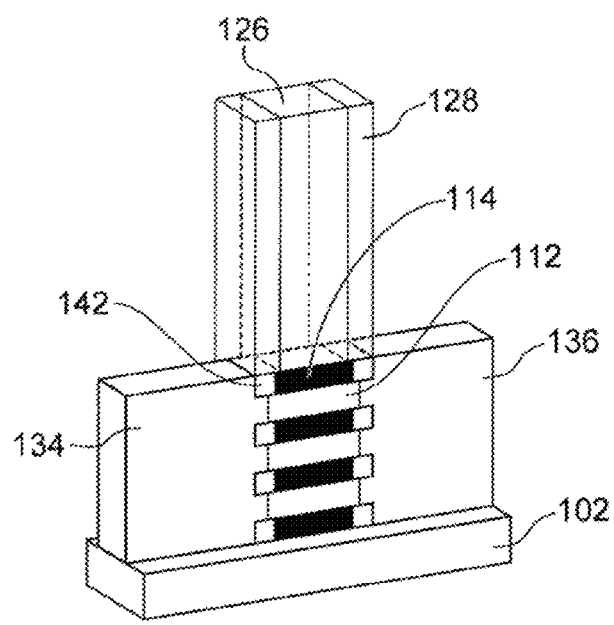

The nanostructures 100 are then selectively etched relative to the other semiconductors, forming cavities 144 at the locations previously occupied by the nanostructures 100, between the internal spacers 142 (FIG. 13). The source and drain regions 134, 136 are then made, as shown in FIG. 14. A part of the semiconductor of the source and drain regions 134, 136 is, in particular, arranged in the cavities 144. The transistor 200 is then completed as described above, that is, by removing the dummy gate 126 as well as the remaining parts of the second portions 114, by making the final gate 138 and by depositing the encapsulation material 140.

Due to the fact that during fabrication of the nanostructures 100 the dimensions of the nanostructures 100 are well-controlled, the dimensions of the cavities 144 are also well-controlled. In this method this good control over the dimensions of the nanostructures 100 is used in particular to make nanostructures 100 such that the cavities 144 have a depth (dimension along the X axis shown in FIG. 13) less than that of the internal spacers 142, that is, such that a region of the remaining parts of the first portions 112 are arranged against the internal spacers 142. This is difficult to achieve in the absence of the nanostructures 100, that is, by directly etching the remaining parts of the first portions 112 from their extremities. If the source and drain regions 134, 136 comprise a semiconductor similar to that of the second portions 114 intended to be etched, it is difficult to etch these second portions 114 without damaging the parts of the source and drain regions 134, 136 located near to the second portions 114.

The various methods described above may be implemented in order to make N or P type transistors.

Another problem that may be solved as a result of the nanostructures 100 is that in a GAA-FET transistor as obtained by implementing the second method described above, that is, possessing internal spacers but which does not comprise the nanostructures 100, the semiconductor portions located between the channel and the source and drain regions, beneath the external spacers, are not doped. Annealing is generally performed which allows dopants to migrate from the source and drain regions towards these semiconductor portions intended to form extension regions with low electrical resistance. In addition to the problems mentioned above associated with the implementation of such annealing and in the case of a P type transistor, the dopants used such as Boron have high diffusivity, which may result in a migration of these dopants to within the channel, thus reducing the transistor performance.

A method for making the transistor 200 according to another embodiment is described below, providing a response in particular to the problem presented above.

The intermediate structure shown in FIG. 12 is first of all made as described above, that is comprising the stack of remaining parts of the first and second portions 112, 114 arranged on the substrate 102, the internal spacers 142, the nanostructures 100, the external spacers 128 and the dummy gate 126.

The source and drain regions 134, 136 doped with boron are then made by epitaxy whilst retaining the nanostructures 100 which comprise, for example, SiGe, between the remaining parts of the first portions 112 forming the channel of the transistor 200 and the source and drain regions 134, 136.

Given that the diffusion of Boron in SiGe is slower than in silicon, the nanostructures 100 form a barrier to these dopants and prevent them diffusing into the channel of the transistor 200 during the activation annealing of these dopants, due to the fact that the boron atoms accumulate in the nanostructures 100 due to their different composition (the SiGe being capable of holding a higher concentration of dopant atoms than the silicon).

The fabrication of nanostructures 100 by surface migration of semiconductor atoms may also serve to make etch stop elements intended to protect the semiconductor of the source and drain regions.

A fifth embodiment of the method making the transistor 200, wherein the internal spacers correspond to nanostructures 100 formed by surface migration of semiconductor atoms, is described below.

The steps described above in association with FIGS. 6 to 8 are first of all implemented, with the difference, however, that the initial stack 104 is made such that each of the second portions 114 is then arranged between two first portions 112 due to the fact that the second portions 114 comprising SiGe are here intended to form the channel of the transistor 200.

Figure 15:
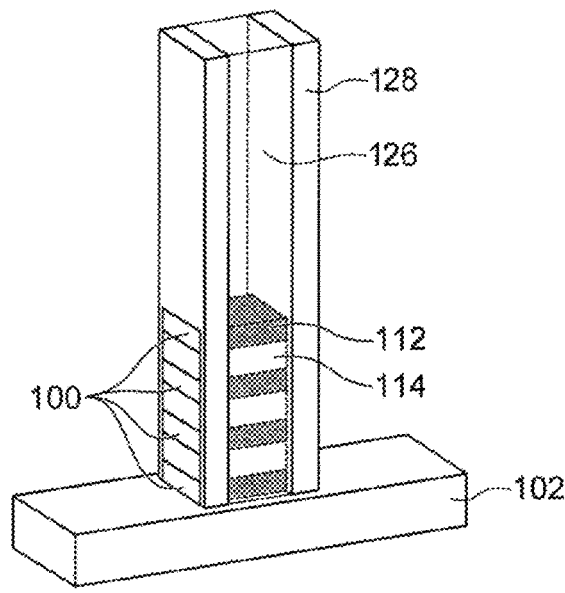
FIGS. 15, 16, 17 and 18 show a part of the steps in a method for making a semiconductor device which is the subject of the present invention, according to a fifth embodiment.

Annealing is then carried out at a temperature which causes surface migration of germanium atoms from the remaining parts of the second portions 114 towards the extremities of the remaining parts of the first portions 112, forming nanostructures 100 at the extremities of the remaining parts of the first portions 112 (FIG. 15).

Figure 16:
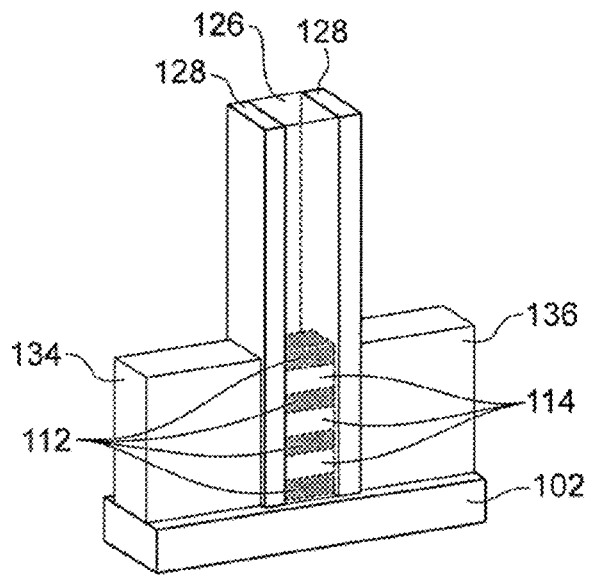

As shown in FIG. 16, the source and drain regions 134, 136 are then made by epitaxy of silicon, and for example doped with boron in the case of a P type transistor 200.

Figure 17:
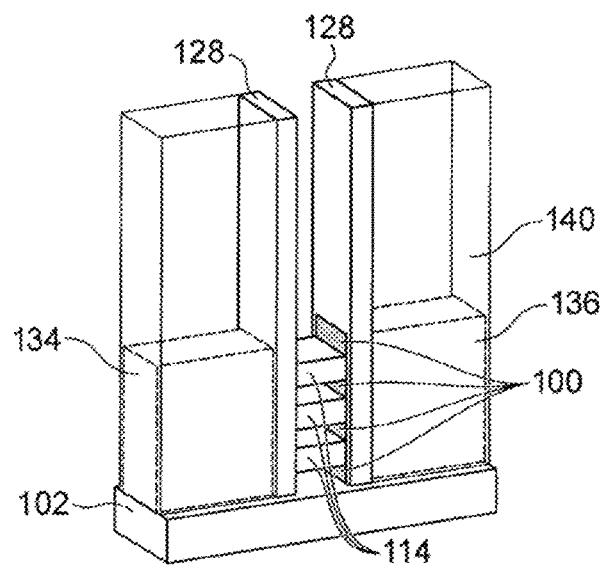

The encapsulation material 140 is then formed on the source and drain regions 134, 136 then the dummy gate 126 is removed by etching. The remaining parts of the first portions 112 are also removed by selective etching relative to the remaining parts of the second portions 114 comprising SiGe (FIG. 17). During this etching the nanostructures serve to stop the etching agent and to protect the source and drain regions 134, 136.

Figure 18:
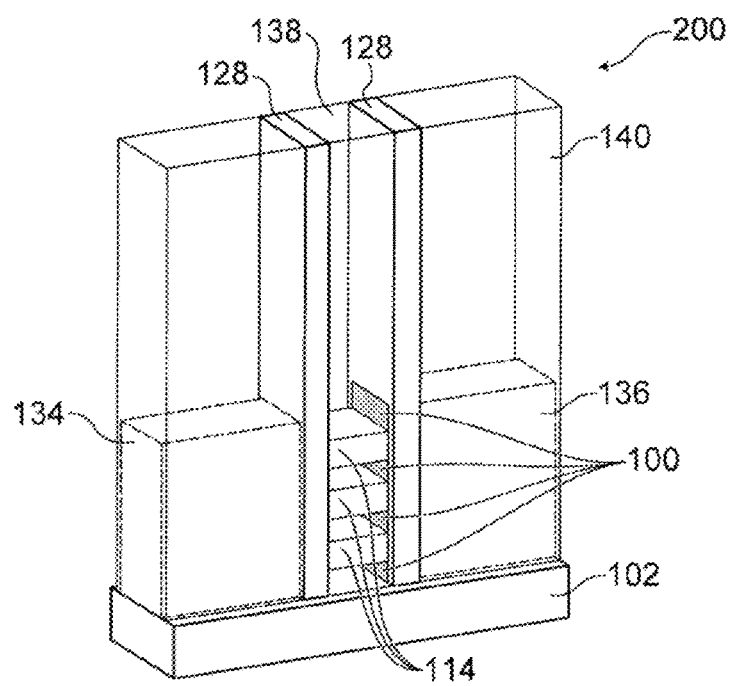

As shown in FIG. 18, the transistor 200 is then completed by making the final gate 138, as described above for the other embodiment methods, by surrounding the remaining parts of the two portions 114 forming the channel of the transistor 200.

A method for making the semiconductor device 200 according to a sixth embodiment method is described below in association with FIGS. 19 to 28.

Figure 19:
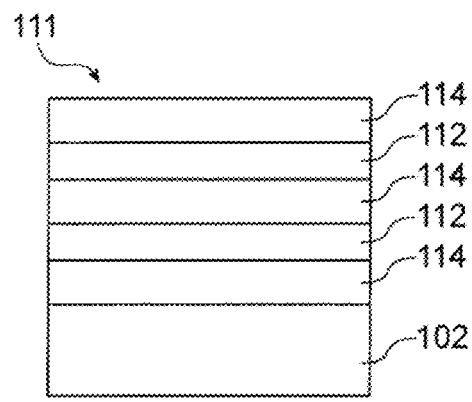
FIGS. 19, 20, 21, 22, 23, 24, 25, 26, 27 and 28 show the steps in a method for making a semiconductor device which is the subject of the present invention, according to a sixth embodiment.

As shown in FIG. 19, the stack 111 is first of all made, comprising the first portions 112 of the first semiconductor (here silicon) and the second portions 114 of the second semiconductor (here SiGe with, for example, a germanium concentration equal to about 50%). This stack 111 may be obtained as described above, that is, from etching of a stack of alternating layers of Si/SiGe.

Figure 20:
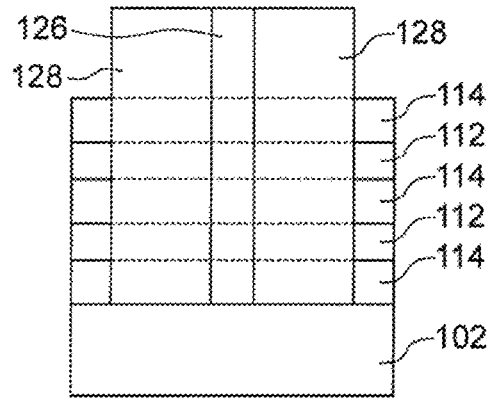

The dummy gate 126 and the external spacers 128 are then made on the stack 111 (FIG. 20).

Figure 21:
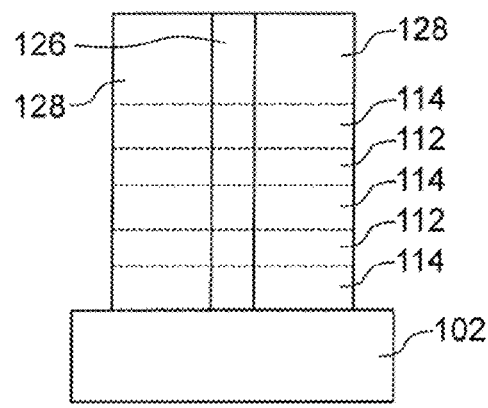

The stack 111 is then etched in order to retain only the parts of the stack 111 which are covered by the dummy gate 126 and the external spacers 128 (FIG. 21).

Figure 22:
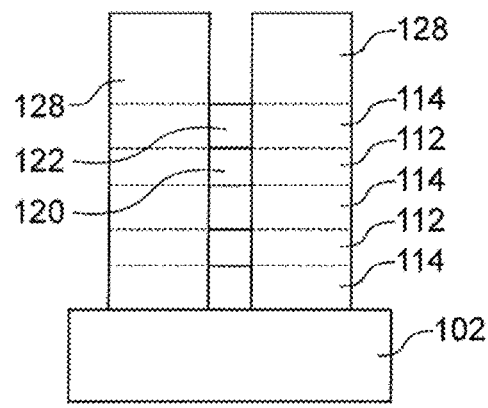
Figure 23:
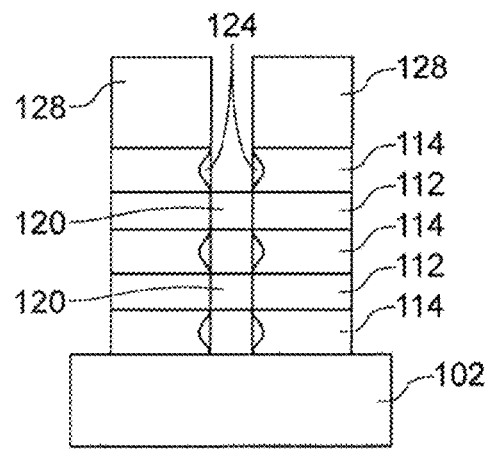
Figure 24:
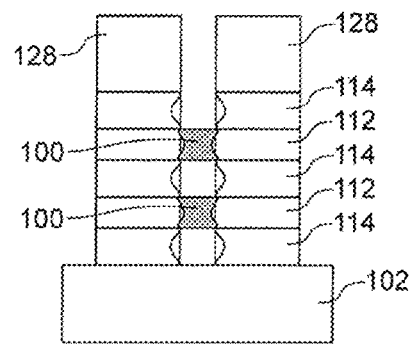

The dummy gate 126 is then removed (FIG. 22). With the removal of this dummy gate the regions 120 of the first portions 112 previously covered by the dummy gate 126 and not covered by the external spacers 128 are revealed and accessible. Similarly, regions 122 of the second portions 114 previously covered by the dummy gate 126 and not covered by the external spacers 128 are revealed by this removal and are accessible.

Selective etching of the second semiconductor (here SiGe) relative to the first semiconductor (here Si) is then implemented in order to remove the exposed regions 122 of the second portions 114. This etching is performed for example using $H_2O_2$. In addition to the removal of the regions 122, this etching also forms cavities or hollows 124 in the parts of the second portions 114 covered by the external spacers 128, at the lateral flanks found to the side of the location of the gate. At the location of the gate only the regions 120 of the first portions 112 are preserved.

Thermal treatment is then carried out in order to cause migration of atoms from the parts of the second portions 114 covered by external spacers 128 to within the regions 120 of the first portions 112. The operating parameters for the thermal treatment are similar to those described in the above embodiments. The nanostructures 100 obtained correspond to quantum islands of SiGe whose germanium concentration is less than that of the SiGe of the second portions 114. The form, the arrangement and the dimensions of the nanostructures 100 are therefore predefined by the choice of initial thickness of the silicon layers from which the first portions 112 arise, by the shape of the first portions 112 and of the dimensions of the dummy gate 126.

Figure 25:
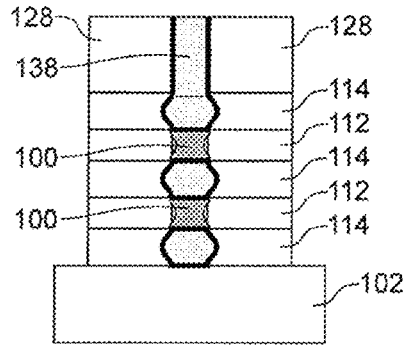

The gate 138 is then made in the location freed by the etching of the dummy gate 126, thus surrounding the quantum islands formed by the nanostructures 100 (FIG. 25).

Figure 26:
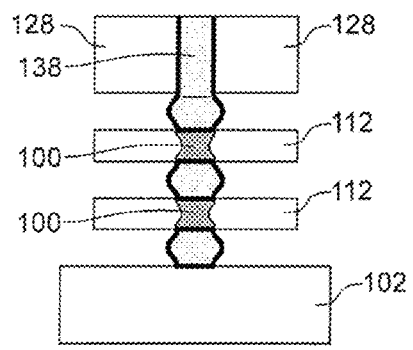

The remaining parts of the second portions 114 are then selectively etched relative to the first portions 112 (FIG. 26).

Figure 27:
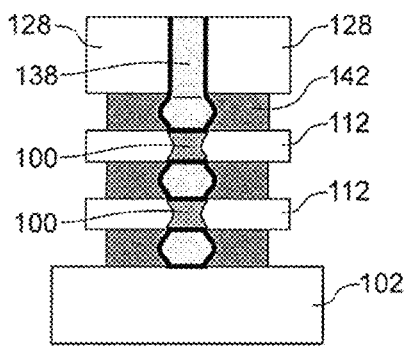

The internal spacers 142 are then made in the locations formed in the preceding step by etching of the remaining parts of the second portions 114 beneath the external spacers 128 (FIG. 27).

Figure 28:
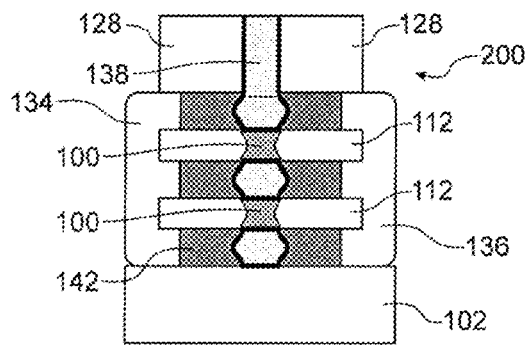

The SET transistor 200 is then completed by forming source and drain regions made of doped semiconductor, by epitaxy from the extremities of the first portions 112 (FIG. 28).

In the SET transistor 200 thus made, the channel is formed from quantum islands of SiGe which correspond to the nanostructures 100 superimposed one upon the other. Coulomb blockade barriers of the SET transistor 200 are formed by the remaining parts of the first portions 112 comprising the first non-doped semiconductor and which allow charge carriers to pass in a unitary manner into the nanostructures 100, where this passage of charge carriers is controlled by the gate 138.

The invention claimed is:

1. A method of fabrication of a semiconductor device, the method comprising:
fabricating at least one stack made on a substrate, comprising at least one first portion of a first semiconductor and at least one second portion of a second semiconductor which is different from the first semiconductor, and wherein the second semiconductor is capable of being selectively etched relative to the first semiconductor or wherein the first semiconductor is capable of being selectively etched relative to the second semiconductor, fabricating, on a part of the stack, external spacers and at least one dummy gate arranged between the external spacers, etching the stack such that the remaining parts of the first and second portions are arranged beneath the dummy gate and beneath the external spacers and form a stack of nanowires, after the etching of the stack, thermally treating the stack of nanowires at a temperature which causes at least one surface migration of atoms of the second semiconductor of the remaining part of the second portion towards least one part of the remaining part of the first portion which exhibits at least one free surface and at and/or within which the nanostructure comprising at least atoms of the second semiconductor is formed, said at least one nanostructure having a thickness which is equal to a thickness of said at least one first portion.

2. The method according to claim 1, wherein:
the first semiconductor comprises Si, and/or
the second semiconductor comprises Ge, and/or
the thermal treatment temperature is between about 750° C. and 850° C., and/or
the thermal treatment is carried out in an atmosphere containing hydrogen.

3. The method according to claim 2 wherein the second semiconductor comprises SiGe which has a germanium concentration between about 20% and 80%.

4. The method according to claim 1, wherein the thickness of the first portion is between about 4 nm and 20 nm.

5. The method according to claim 1, wherein the stack comprises several alternating first and second portions, aid wherein the implementation of the thermal treatment causes at least one surface migration of atoms of the second semiconductor from the remaining parts of the second portions towards parts of the remaining parts of the first portions which each exhibit at least one free surface and at each of which at least one nanostructure comprising at least atoms of the second semiconductor is formed.

6. The method according to claim 5, wherein several second portions comprise second semiconductors with different atomic compositions and/or different concentrations from one to another, forming nanostructures which comprise different semiconductors.

7. The method according to claim 6, wherein each second portion may comprise SiGe which has a concentration of germanium which is different from that of the SiGe of other second portions.

8. The method according to claim 5, wherein each of the several of the first portions have different thicknesses, and/or each of the several of the second portions have different thicknesses.

9. The method according to claim 1, wherein:
the second semiconductor is capable of being selectively etched relative to the first semiconductor,
said at least one part of the remaining part of the first portion corresponds to extremities of the remaining part of the first portion,
and wherein the method further comprises, after the implementation of the thermal treatment forming nanostructures at the extremities of the remaining part of the first portion:
fabrication of source and drain regions by epitaxy of semiconductor from at least the nanostructures, and such that the second semiconductor is capable of being selectively etched relative to the semiconductor of the source and drain regions, removal of the dummy gate and of the remaining part of the second portion, and fabrication of a gate between the external spacers and surrounding a channel of the semiconductor device formed by the remaining part of the first portion.

10. The method according to claim 9, wherein the semiconductor of the source and drain region is doped silicon.

11. The method according to claim 9, further comprising between the stack etching step and the source and drain regions fabrication:
partial etching of the remaining part of the second portion from the extremities of the remaining part of the second portion revealed by the etching of the stack, forming cavities arranged at least beneath the external spacers, and
fabrication of internal spacers within the cavities.

12. The method according to claim 9, further comprising, between the thermal treatment step and the step for making the source and drain regions, removing the nanostructures, where the source and drain regions are made by epitaxy of semiconductor from at least the remaining portion of the first portion.

13. The method according to claim 9, wherein:
the method further comprises, between the step for making the source and drain regions and the step for removing the dummy gate and the remaining part of the second portion, doping of the semiconductor of source and drain regions, then annealing which diffuses dopants into the semiconductor of the source and drain regions, or
the step for making the source and drain regions is implemented such that the semiconductor of the source and chain regions is doped.

14. The method according to claim 1, wherein:
the first semiconductor is capable of being selectively etched relative to the second semiconductor,
said at least one part of the remaining part of the first portion corresponds to the extremities of the remaining part of the first portion and the nanostructures form etch stop elements intended to protect the semiconductor of the source and drain regions,
and wherein the method further comprises, after implementation of the thermal treatment forming, nanostructures at the extremities of the remaining part of the first portion:
fabrication of source and drain regions by epitaxy of semiconductor from at least the nanostructures and the remaining part of the second portion,
removal of the dummy gate and of the remaining part of the first portion, and
fabrication of a gate between the external spacers and surrounding a channel of the semiconductor device formed by the remaining part of the second portion.

15. The method according to claim 1, wherein the second semiconductor is capable of being selectively etched relative to the first semiconductor,
wherein the method further comprises, between the etching of the stack and the thermal treatment of the stack:
removal of the dummy gate, and
etching of at least one region of the remaining part of the second portion not covered by the external spacers, and wherein said at least one part of the remaining part of the first portion corresponds to a region of the remaining part of the first portion not covered by external spacers, where the method further comprises, after the thermal treatment has been carried out:

fabrication of a gate between the external spacers covering the nanostructure, etching of the remaining part of the second portion, fabrication of internal spacers beneath the external spacers and in the locations formed by etching of the remaining part of the second portion, and fabrication of source and drain regions by epitaxy of semiconductor from at least the remaining part of the first portion.

* * * * *